(12) United States Patent
Florian et al.

(10) Patent No.: US 7,304,414 B2
(45) Date of Patent: Dec. 4, 2007

(54) PIEZOACTUATOR AND METHOD FOR THE PRODUCTION THEREOF

(75) Inventors: Heinz Florian, Bad Gams (AT); Klaus Reichmann, Graz (AT); Gerald Kainz, Graz (AT)

(73) Assignee: EPCOS AG, Munich (DE)

( * ) Notice: Subject to any disclaimer, the term of this patent is extended or adjusted under 35 U.S.C. 154(b) by 17 days.

(21) Appl. No.: 10/513,568

(22) PCT Filed: May 6, 2003

(86) PCT No.: PCT/DE03/01451

§ 371 (c)(1),
(2), (4) Date: Jun. 22, 2005

(87) PCT Pub. No.: WO03/094252

PCT Pub. Date: Nov. 13, 2003

(65) Prior Publication Data

US 2005/0236933 A1    Oct. 27, 2005

(30) Foreign Application Priority Data

May 6, 2002 (DE) ............... 102 20 136
Jan. 23, 2003 (DE) ............... 103 02 600

(51) Int. Cl.
*H01L 41/08* (2006.01)
(52) U.S. Cl. ..................................... 310/328
(58) Field of Classification Search ........... 310/328, 310/363, 364, 366
See application file for complete search history.

(56) References Cited

U.S. PATENT DOCUMENTS 4,471,256 A * 9/1984 Igashira et al. ............. 310/328
4,523,121 A * 6/1985 Takahashi et al. .......... 310/334
6,232,701 B1   5/2001 Schuh et al.
6,297,576 B1  10/2001 Wang et al.
6,411,018 B1   6/2002 Heinz

FOREIGN PATENT DOCUMENTS

| DE | 196 26 671 | 10/1997 |
|---|---|---|
| DE | 196 34 488 | 3/1998 |
| DE | 199 09 482 | 9/2000 |
| DE | 199 28 189 | 4/2001 |
| DE | 196 25 921 | 6/2001 |
| DE | 198 60 001 | 10/2001 |
| DE | 100 41 338 | 3/2002 |
| DE | 101 30 078 | 4/2002 |
| JP | 2-192186 | 7/1990 |
| JP | 03151677 | 6/1991 |
| JP | 4-73978 | 3/1992 |
| WO | 100 24 701 | 11/2001 |
| WO | WO02/19441 | 3/2002 |

* cited by examiner

*Primary Examiner*—Mark Budd
(74) *Attorney, Agent, or Firm*—Fish & Richardson P.C.

(57) ABSTRACT

A piezoactuator includes a base. The base contains a stack of piezoelectric layers and electrode layers interspersed among the piezoelectric layers. The piezoelectric layers contain a ceramic material; the piezoelectric layers and the electrode layers are sintered together; and the base has a hole therethrough. The piezoactuator also includes a contact element, such as a pin, in the hole. The contact element is for use in forming an electrical connection to at least some of the electrode layers.

27 Claims, 4 Drawing Sheets

PIEZOACTUATOR AND METHOD FOR THE PRODUCTION THEREOF

TECHNICAL FIELD

This patent application relates to a piezoactuator with superimposed piezoelectric layers and electrode layers disposed between them. Furthermore, this patent application relates to a method for the production of the piezoactuator.

BACKGROUND

From the reference DE 100 24 701 A1, a piezoactuator is known that contains piezo layers and interior electrodes disposed between these layers in a multilayer structure. The interior electrodes are alternately contacted with external connection contacts. The respective connected interior electrodes, together with the functional elements, which are arranged in an isolated manner relative to the respective other electrodes and form feedthroughs in the piezo layers, are electrically interconnected. As a result, it is possible to contact the electrode layers of the piezoactuator on the inside surface of the actuator. The feedthroughs within the piezo layers are executed by known technology Via, as it is known, for example, from the structure of LTCC substrates. In this process, holes are stamped into the ceramic green foils used to produce the piezoactuator and are subsequently filled with a so-called Via-fill paste, and then sintered together with the green foils.

Furthermore, a piezoactuator is known from the reference DE 199 09 482, in which a hole passes through the actuator. An electrode connection for contacting the interior electrodes is disposed on the interior wall of the hole. In addition, a metal pin is passed through the hole and is used to apply a mechanical prestress.

SUMMARY

Described herein is a piezoactuator in which an easily manufactured functional element is disposed inside the piezoactuator and in which the functional element can assume various functions.

What is specified is a piezoactuator having a base body that contains a stack of superimposed piezoelectric layers and electrode layers disposed between these layers. The piezoelectric layers contain ceramic material and are sintered with the electrode layers. In the electrode layers, a hole passes through the base body. A preformed contact element for contacting the electrode layers is inserted into the hole.

An advantage of the piezoactuator is that the preformed contact element, as a functional element, can be brought easily into the interior of the base body. Another advantage of the piezoactuator is that the functional element can perform multiple functions because of its predetermined form and its mechanical stability.

The contact element is advantageously in direct electrical contact with the electrode layers.

It is advantageous, in this context, if the preformed contact element is a pin including a material that is stable with respect to the temperatures occurring during sintering of the piezoactuator, so that, unlike the metalliferous pastes normally used for the electrode layers and feedthroughs, it is not subject to sintering shrinkage. A dimensionally stable pin of this nature is characterized by uniform mechanical properties that make it possible to use the pin for clamping the piezoactuator.

However, the piezoactuator is not limited to a preformed contact element in the form of a pin but instead relates to all contact elements that are preformed and can be inserted into a hole in the base body. Accordingly, the following embodiments, though described only in reference to a pin, are also applicable to other forms of the preformed contact element.

In addition, a method for the production of the piezoactuator is specified, wherein the following steps are used:

a) Formation of a layered stack of superimposed ceramic green foils and electrode layers disposed between them b) Drilling of a hole in the layered stack c) Insertion of a preformed contact element into the hole.

An advantage of the method is that it is possible, using simple techniques, namely drilling a single hole to insert the functional element, such as a pin, into the interior of the piezoactuator.

The pin in the interior of the piezoactuator can be used, for example, to contact electrode layers within the piezoactuator. This is achieved, in particular, when the pin includes an electrically conductive material, such as metal.

In a first embodiment, the pin can be inserted into the layered stack prior to decarbonizing and prior to sintering. In this case, it is advantageous to match the dimensions of the hole to the dimensions of the pin in such a way that, following sintering of the layered stack, the shrinkage of the ceramic material contained in the piezoelectric layers essentially causes said ceramic material to shrink onto the pin, thereby allowing for electrical contact of the pin with electrode layers.

It is also advantageous, in this context, when at least 50% of the pin, at least on its surface, includes the same metal as the electrode layers. This ensures a relatively strong chemical bond between the pin and the electrode layers, which improves the electrical contact between the pin and the electrode layers.

In another embodiment, the pin and/or the formation of the hold can be executed after decarbonizing and sintering of the layered stack. In this case, that is, if the pin, in turn, is to be used for contacting the electrode layers, it is advantageous if the dimensions of the hole and the pin are matched in such a way that in the sintered state of the layered stack, the pin can still be pushed through the hole, i.e., a certain minimum play exists between the interior wall of the layered stack and the exterior wall of the pin. To achieve a secure contact, it is then advantageous to apply graphite or another electrically conductive lubricant to the pin, for example, that makes it possible to fill the space needed for insertion of the pin and thus achieve a good contact between the pin and the electrode layer.

If the hole is drilled into the layered stack before the decarbonizing and sintering steps take place, it is advantageous if the hole is drilled with a sintered carbide drill because this makes it possible to produce as clean and straight a hole as possible, which may be important in ensuring electrical contact between the electrode layers and the pin later on, that is, after sintering.

In addition, the pin can also be used to produce a mechanical clamp for the piezoactuator. As is known, it is advantageous to prestress a piezoactuator in a longitudinal direction, so that it can be used optimally as an actuator generating expansion in this longitudinal direction. A prestress can be produced with the pin by taking advantage of the fact that the ceramic material in the layered stack shrinks during sintering. Thus, by using suitable hole and pin dimensions and by shrinking the ceramic material onto the pin, a positive or non-positive fit can be established between the pin and the piezoactuator. To this end, it is advantageous, on the one hand, to use suitable dimensions for the hole and pin and, on the other, to use suitable materials for the pin, namely a dimensionally stable material that does not experience any shrinkage during sintering.

A positive fit is generally advantageous to establish the electrical contact between the pin and electrode layers.

The non-positive fit between the pin and the layered stack is advantageous when the pin is to be used for mechanical clamping of the piezoactuator. A mechanical prestress is achieved by selecting a pin whose thermal expansion coefficient is greater than the thermal expansion coefficient of the sintered ceramic material. The pin is inserted into the hole prior to sintering, and, after final sintering, the piezoactuator is cooled to room temperature. The pin, which is non-positively fitted to the piezoactuator, shrinks to a greater degree than the piezoactuator itself, so that the pin is under tensile stress relative to the base body of the piezoactuator, providing the piezoactuator with the necessary mechanical clamping.

However, the establishment of a mechanical clamp for the piezoactuator using the pin can also be accomplished in a different way. To this end, it is possible to wait until after the piezoactuator has been sintered to insert the pin into the hole. Then the piezoactuator is clamped between two plates that are disposed at the base or top surface of the layered stack. While the mechanical pressure that presses the two plates together is being applied, the pin passing through the interior of the piezoactuator is secured to the plates, so that, even after removal of the external mechanical tension, the piezoactuator is under a mechanical prestress.

It is also conceivable to execute the pin in the form of a torsion spring. Such a torsion spring is obtained, for example, by executing the pin in the form of steel fibers that are stranded together.

At this point, the mechanical prestress of the piezoactuator can be generated by securing the pin to the upper side and the lower side of the layered stack, to a plate, in each case, and then rotating the plates to build compressive strain in the longitudinal direction of the piezoactuator.

In one embodiment, several pins are arranged within the piezoactuator. For example, four pins can be arranged, two of which are used for electrical contacting with the electrode layers and the two others to create the mechanical clamping of the piezoactuator.

In another embodiment, the hole is disposed along a longitudinal central axis of the base body, and a pin including two semi-circular partial pins is inserted into the hole. The two partial pins are electrically insulated from one another by a foil containing ceramic material. Thus, the two partial pins can achieve electrical contacting of the electrode layers via two different external poles of the piezoactuator.

If suitable measures are taken with regard to the dimensions of the hole and sintering of the ceramic material, the pin including two partial pins or a single-piece pin can be used simultaneously as an element for producing the prestress of the piezoactuator. In this case, another advantage of this embodiment is that the prestress is generated in the center of the piezoactuator, which results in systematic construction of the piezoactuator and, for example, helps to prevent the bending of the piezoactuator that frequently occurs when prestress elements are disposed on the exterior of the piezoactuator.

In the following, the piezoactuator and method for its production will be explained in greater detail, using exemplary embodiments and the related figures.

DETAILED DESCRIPTION

Figure 1:
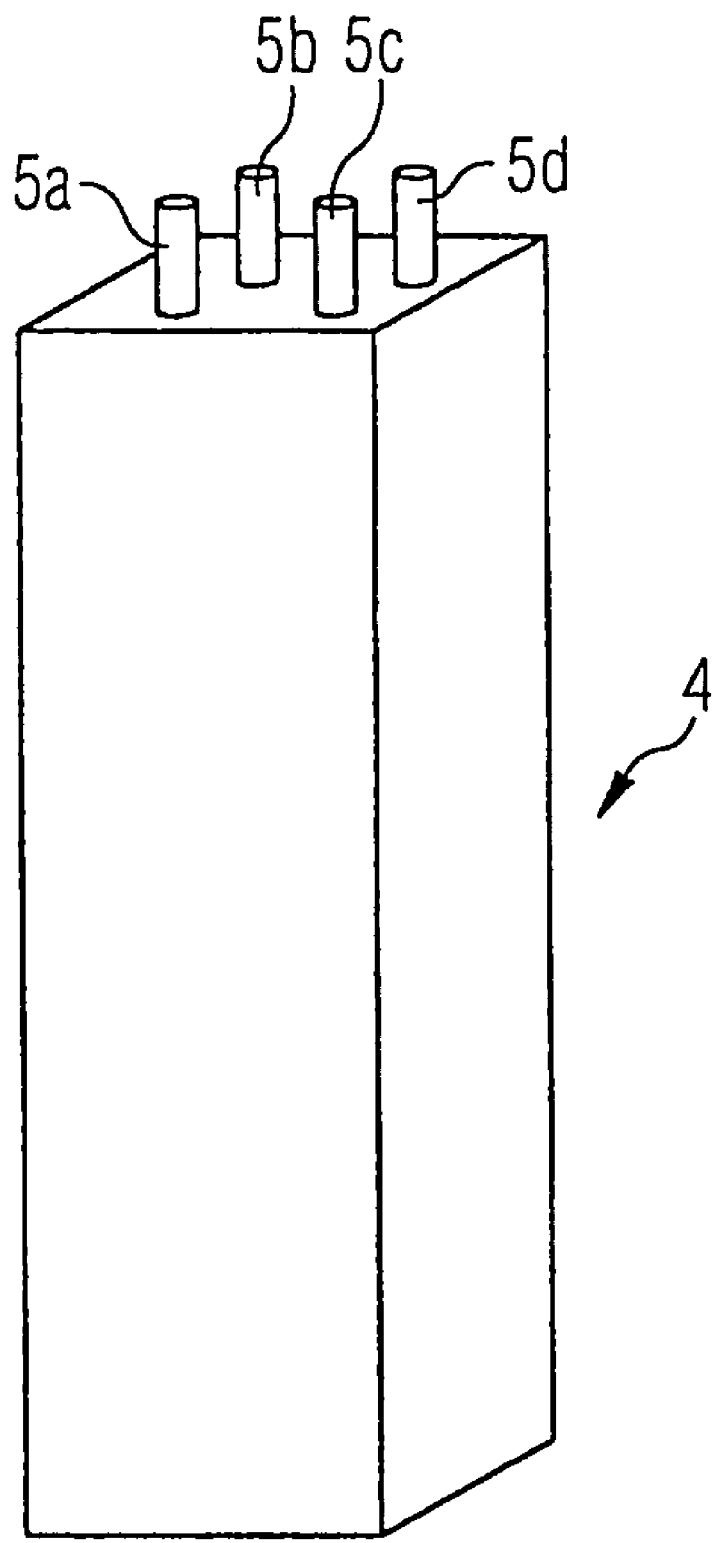
FIG. 1 shows a piezoactuator in a perspective view.

FIG. 1 shows a piezoactuator with a base body 4, in which four holes are drilled in longitudinal direction. A pin 5a, 5b, 5c, 5d sits in each of the holes.

Figure 2:
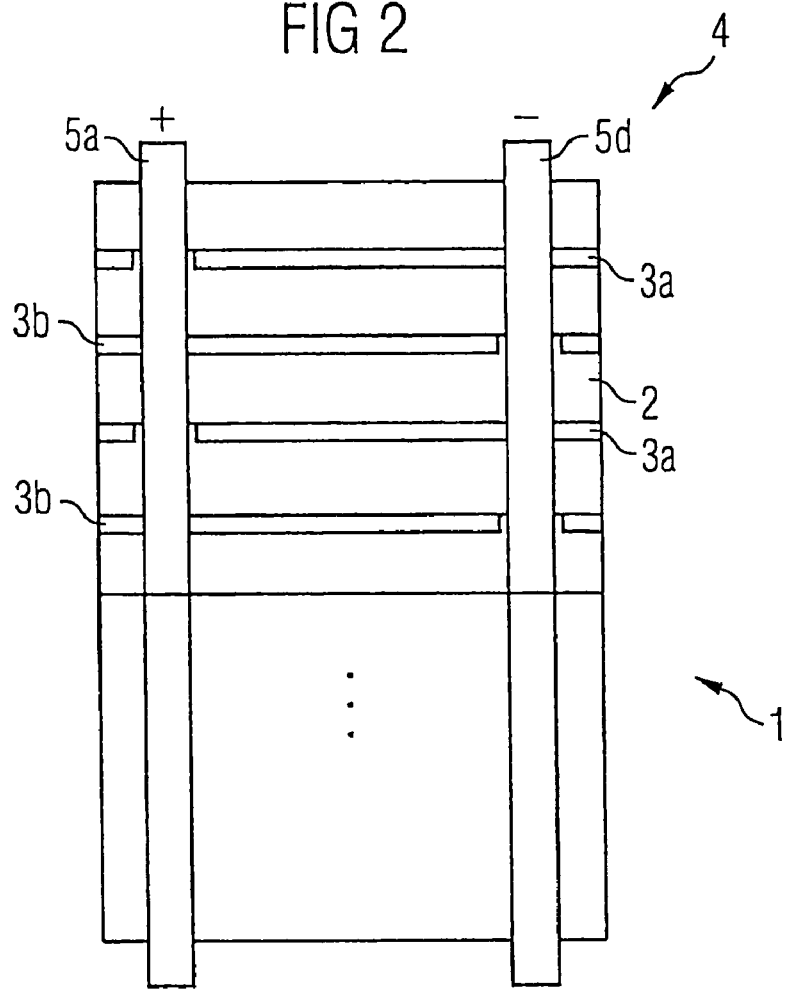
FIG. 2 shows a piezoactuator in schematic longitudinal section.

FIG. 2 shows a piezoactuator with two pins 5a, 5d. It includes a stack 1 of superimposed piezoelectric layers 2. The piezoelectric layers 2 includes a piezoceramic, which comprises 67 wt. % $Pb_3O_4$, ca. 1 wt. % $Nd_2O_3$, 21 wt. % $ZrO_2$, and ca. 11 wt. % $TiO_2$. However, the claims of this patent application are not limited to this type of piezoceramic but instead can cover all piezoelectric layers 2 with suitable piezoelectric characteristics.

The stack 1 has electrode layers 3a, 3b that are superimposed upon one another, resulting in accumulation of the piezoelectric effects of many piezoelectric layers 2. The electrode layers 3a, 3b comprises a mixture of silver and palladium at a weight ratio of between 90/10 and 70/30. Because the stack 1 is produced by joint sintering of electrode layers 3a, 3b and piezoelectric layers 2, all metals or metal alloys that are stable under sintering conditions are suitable as electrode layers 3a, 3b. Thus, electrode layers 3a, 3b made of copper, in particular, are also possible. The respective electrode layers 3a, 3b corresponding to a pin 5a, 5d are connected to said pin in an electrically conductive manner.

The stack 1 has a cubic shape with a base of 7×7 mm, and a height of 60 mm.

In addition, two electrode layers 3a, 3b are arranged between the piezoelectric layers 2. The electrode layers 3a are electrically contacted with the pin 5b. The electrode layers 3b have insulation zones at the position of the pin 5b, so that the electrode layers 3b are electrically insulated from the pin 5b. However, the electrode layers 3b are electrically contacted with the pin 5a. Because superimposed electrode layers 3a, 3b that can be contacted alternately with different poles are now present, the effects of a plurality of piezoelectric layers 2 are added together.

Figure 2A:
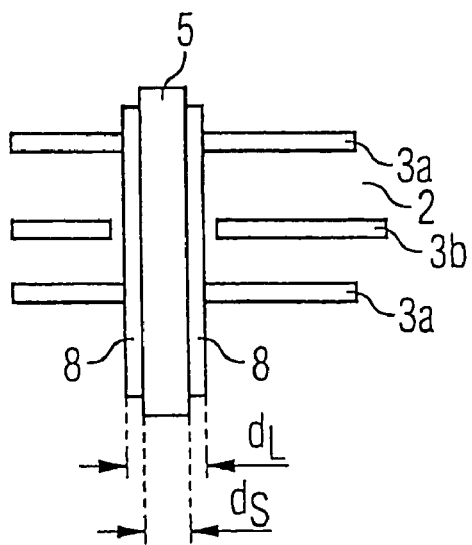
FIG. 2a shows the contact region of a pin contacted via an electrically conducted lubricant.

FIG. 2A shows the contact zones of a pin 5 that produces contact to the electrode layers 3a via an electrically conductive lubricant 8. In this case, the dimension of the hole $d_L$ is larger than the dimension of the pin $d_S$, which permits the pin 5 to be inserted into the hole, even after sintering of the layered stack 1. To fill the space between the pin and the interior wall of the piezoactuator for the purpose of contacting the electrode layers 3a, an electrically conductive lubricant 8, such as graphite, is applied to the surface of the pin 5. This graphite layer now provides the electrical contact between the electrode layers 3a and the pin 5, which can serve as an exterior contact of the piezoactuator.

Figure 3:
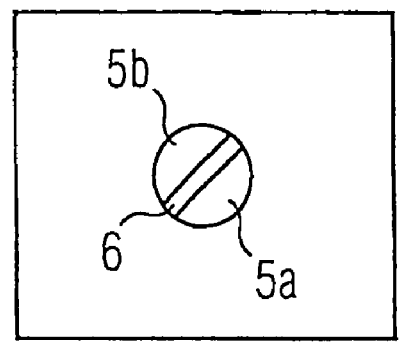
FIG. 3 shows a piezoactuator in top view.

FIG. 3 shows another embodiment in top view, in which a central hole in the longitudinal direction of the piezoactuator is filled with a pin comprising two partial pins 5a and 5b that are semicircular in cross-section. A ceramic-containing foil 6 is glued in place between the two flat peripheries of the partial pins 5a, 5b. This ceramic-containing foil 6 may include the same ceramic material as the piezoelectric layers 3, to allow for improved sintering behavior. The ceramic-containing foil 6 also causes electrical insulation of the two partial pints 5a, 5b, which is why the alternating electrical contacting of the electrode layers by the pins 5a, 5b can be achieved in a manner similar to that shown in FIG. 2.

Figure 4:
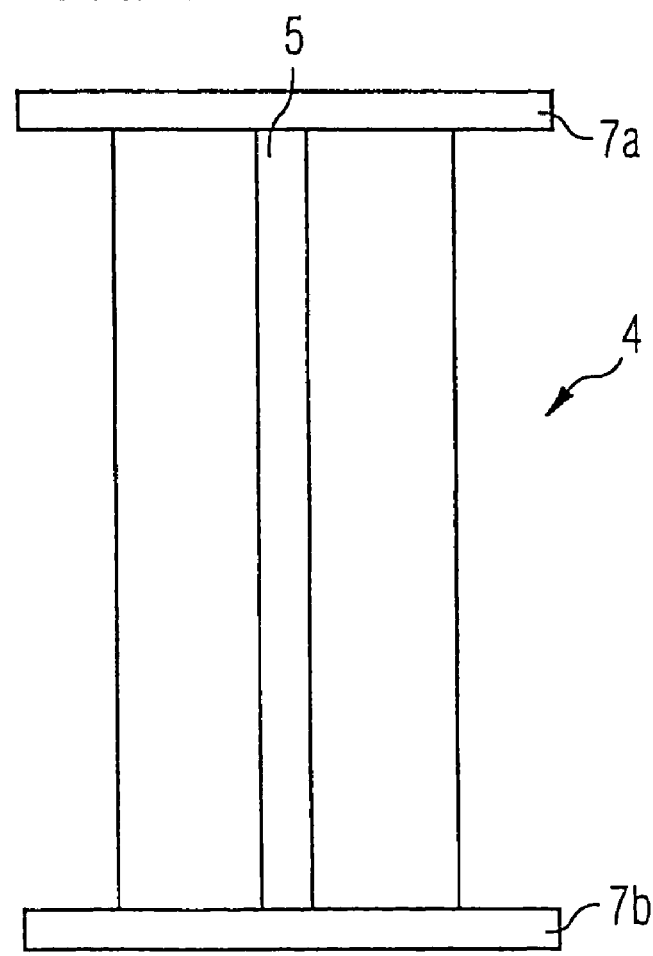
FIG. 4 shows a piezoactuator in schematic longitudinal section.

FIG. 4 shows another embodiment, in which the base body 4 of the piezoactuator is clamped between two plates 7a and 7b. In the case of the plates 7a and 7b are attached to the pin 5.

Figure 5:
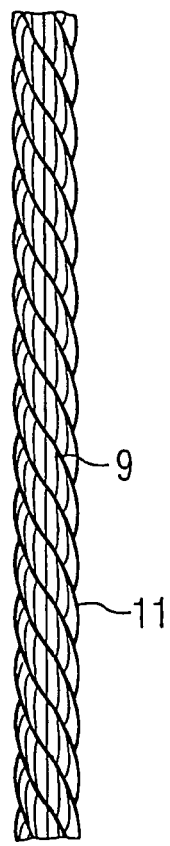
FIG. 5 shows a stranded conductor that can be used as a pin, in top view.

FIG. 5 shows a preformed contact element for the piezoactuator, said contact element having an inner structure. An inner structure can advantageously have the preformed contact element be a stranded conductor 9, which is produced from a plurality of wires 11 via twisting.

FIG. 5 shows a stranded conductor 9, which is produced via twisting wires 11, and which can be used as a preformed contact element for the inner contacting of the interior electrodes of a piezoactuator. As a result of the twisting of wires 11, the stranded conductor 9 achieves sufficient mechanical stability to enable it to be inserted into a hole in the piezoactuator or in the base body of the piezoactuator.

To simplify the insertion of the preformed contact elements in the form of a stranded conductor 9 even further, it can be provided that the stranded conductor 9 be mechanically stabilized at one of its ends. Such mechanical stabilization can be accomplished by crimping or mechanical compression, for example. Instead of a stranded conductor 9, it is also possible to use a cable of wires. In addition, all other structural forms of stranded conductors and/or cables in accordance with DIN 3051 are conceivable. In particular, stranded conductors that are simply bunched or symmetrically bunched are also possible. In this regard, a symmetrically bunched stranded conductor is defined as a stranded conductor that has, in addition to a central reinforcing wire (core strand), additional, more outlying wires disposed along concentric circles around the core strand. In this regard, 6 wires are disposed along a first, innermost circle around the core strand and, if applicable, 12 wires are disposed along a subsequent, larger circle and 18 wire, 24 wires, etc., are disposed along additional circles. It is also possible to strand a plurality of stranded conductors together to form a thick cable.

Figure 6:
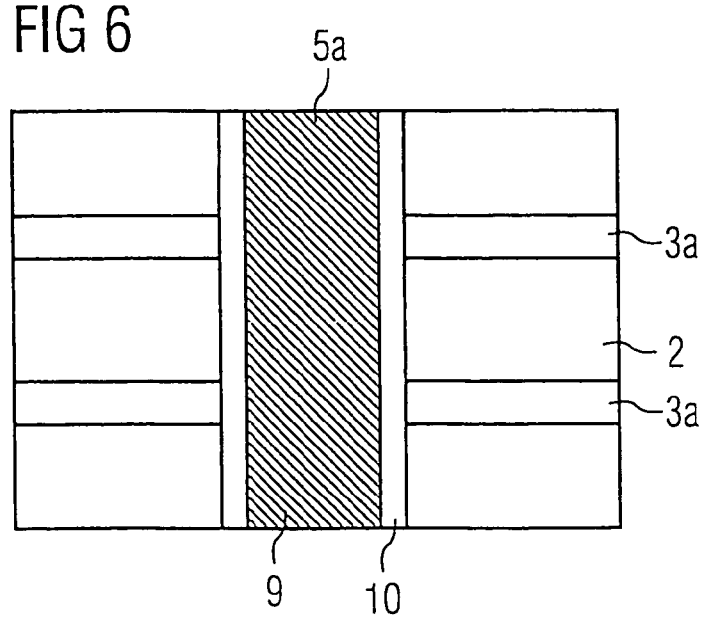
FIG. 6 shows the contacting of electrode layers via a stranded conductor according to FIG. 5 in schematic cross-section.

FIG. 6 shows the contacting of electrode layers 3a in the interior of a piezoactuator via a stranded conductor 9, which performs the function of the preformed contact element. For the purpose of contacting, the exterior of the stranded conductor 9 is provided with an electrically conductive coating 10, such as a metalliferous burn-in paste. It is advantageous to use, at least in part, the material to make the electrode layers 3a as the material for the coating 10. When copper interior electrodes are used as electrode layers 3a, for example, it is advantageous to provide the stranded conductor 9 with a coating 10 including a cupriferous burn-in paste. As a result, the materials of the coating 10 and the electrode layers 3a are optimally adapted to one another, which helps reduce the electrical contact resistance between the electrode layer 3a and the stranded conductor 9.

In addition, the interior of the stranded conductor 9 can be provided with a paste and/or the material of the coating 10, so as to glue together the individual wires 11 of the stranded conductor 9 and thus increase the mechanical stability of the stranded conductor 9, thereby improving the insertion of the stranded conductor into the hold in the base body.

The invention claimed is:

1. A piezoactuator comprising:
    a base comprising:
        a stack of piezoelectric layers; and
        electrode layers among the piezoelectric layers;
        wherein the piezoelectric layers comprise a ceramic material, the piezoelectric layers and the electrode layers are sintered together, and the base has a hole therethrough; and
    a contact element in the hole, the contact element for use in forming an electrical connection to at least some of the electrode layers, wherein the contact element comprises a material that does not substantially shrink during sintering, and wherein the contact element is under tensile stress relative to the base.

2. The piezoactuator of claim 1, wherein the contact element comprises a pin.

3. The piezoactuator of claim 1, wherein sintering causes the ceramic material to contract towards the contact element such that the ceramic material is closer to the contact element after sintering than before sintering.

4. The piezoactuator of claim 2, wherein the pin is under tensile stress relative to the base.

5. The piezoactuator of claim 2, wherein the pin comprises two semicircular partial pins that are separated from one another by foil comprising a ceramic.

6. The piezoactuator of claim 2, wherein the pin comprises at least half of a same material that makes up the electrode layers.

7. The piezoactuator of claim 2, further comprising first and second plates that are at top and bottom surfaces, respectively, of the base and that are secured to the pin.

8. The piezoactuator of claim 2, wherein the pin comprises metal.

9. The piezoactuator of claim 2, wherein the pin comprises fibers that are woven together.

10. A method of forming of a piezoactuator according to claim 1, the method comprising:
    forming the base comprised of the stack of piezoelectric layers and electrode layers;
    drilling the hole in the base; and
    inserting the contact element into the hole.

11. The method of claim 10, further comprising decarbonizing the base and sintering the base after inserting the contact element into the hole.

12. The method of claim 10, wherein drilling is performed using a sintered carbide drill.

13. The method of claim 10, wherein the contact element comprises a pin that contains two partial pins separated by a foil comprising a ceramic.

14. The method of claim 11, wherein, during sintering, the ceramic material shrinks towards the contact element.

15. The method of claim 14, wherein, following sintering, a space exists between the ceramic material and the contact element.

16. The method of claim 11, wherein the contact element has a thermal expansion coefficient that is greater than a thermal expansion coefficient of the ceramic material following sintering.

17. The piezoactuator of claim 1, wherein the contact element comprises an inner structure.

18. The piezoactuator of claim 17, wherein the inner structure comprises one or more strands of conductor.

19. The piezoactuator of claim 18, wherein the conductor comprises copper wire.

20. The piezoactuator of claim 18, wherein at least one end of the one or more strands of conductor is mechanically stabilized.

21. The piezoactuator of claim 18, wherein the one or more strands of conductor define a surface containing a paste comprised of metal.

22. The piezoactuator of claim 21, wherein the one or more strands of conductor define a single conductor, the single conductor comprising the paste on an interior thereof.

23. The piezoactuator of claim 1, wherein the hole extends along an entirety of the base.

24. The piezoactuator of claim 1, wherein the contact element has a thermal expansion coefficient that is greater than a thermal expansion coefficient of the ceramic material following sintering.

25. The piezoactuator of claim 1, further comprising a conductive paste between the contact element and the electrode layers, the conductive paste for use in forming the electrical connection.

26. The piezoactuator of claim 1, wherein the ceramic material contacts the contact elements directly.

27. A piezoactuator comprising:

a base comprising:

a stack of piezoelectric layers; and electrode layers among the piezoelectric layers;

wherein the piezoelectric layers comprise a ceramic material, the piezoelectric layers and the electrode layers are sintered together, and the base has a hole therethrough; and a contact element in the hole, the contact element for use in forming an electrical connection to at least some of the electrode layers;

wherein the contact element comprises a pin, and wherein the pin comprises two semicircular partial pins that are separated from one another by foil comprising a ceramic.

* * * * *